United States Patent
Wang et al.

(10) Patent No.: US 9,337,059 B2
(45) Date of Patent: May 10, 2016

(54) APPARATUS AND METHODS FOR ANNEALING WAFERS

(75) Inventors: Yi-Chao Wang, Hsin-Chu (TW);
Yu-Chang Lin, Linkou Shiang (TW);
Li-Ting Wang, Tainin (TW); Tai-Chun Huang, Hsin-Chu (TW); Pei-Ren Jeng, Chu-Bei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 963 days.

(21) Appl. No.: 13/215,909

(22) Filed: Aug. 23, 2011

(65) Prior Publication Data

US 2013/0052837 A1    Feb. 28, 2013

(51) Int. Cl.
| | |
|---|---|
| *H01L 21/00* | (2006.01) |
| *H01L 21/324* | (2006.01) |
| *H01L 21/268* | (2006.01) |
| *H01L 21/20* | (2006.01) |
| *H01L 21/36* | (2006.01) |
| *H01L 21/44* | (2006.01) |

(52) U.S. Cl.
CPC ............ *H01L 21/324* (2013.01); *H01L 21/268* (2013.01)

(58) Field of Classification Search
None
See application file for complete search history.

(56) References Cited

U.S. PATENT DOCUMENTS

| | | | | |
|---|---|---|---|---|
| 8,071,908 | B1* | 12/2011 | Anikitchev | 219/121.65 |
| 2006/0176920 | A1* | 8/2006 | Park | 372/38.02 |
| 2007/0232083 | A1* | 10/2007 | Itani | 438/795 |
| 2009/0296774 | A1* | 12/2009 | Koelmel et al. | 374/121 |
| 2010/0099268 | A1* | 4/2010 | Timans | 438/761 |
| 2011/0195535 | A1* | 8/2011 | Koyanagi et al. | 438/33 |
| 2011/0249071 | A1* | 10/2011 | Grek et al. | 347/246 |

* cited by examiner

*Primary Examiner* — Calvin Choi
(74) *Attorney, Agent, or Firm* — Slater & Matsil, L.L.P.

(57) ABSTRACT

A method includes performing an anneal on a wafer. The wafer includes a wafer-edge region, and an inner region encircled by the wafer-edge region. During the anneal, a first power applied on a portion of the wafer-edge region is at least lower than a second power for annealing the inner region.

19 Claims, 5 Drawing Sheets

APPARATUS AND METHODS FOR ANNEALING WAFERS

BACKGROUND

Laser anneal is a commonly used anneal method in the manufacturing of semiconductor wafers. For example, source and drain regions of transistors are often formed by implanting p-type or n-type impurities. The implanted impurities may be activated using the laser anneal. During a typical laser anneal process, a wafer is scanned with a laser beam, which is projected on a small portion of the wafer at a time, and the laser beam steps forward until all of the wafer is scanned by the laser beam.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of annealing wafers using laser anneal is provided in accordance with an embodiment. The variations and the operation of the embodiment are discussed. Throughout the various views and illustrative embodiments, like reference numbers are used to designate like elements.

Figure 1:
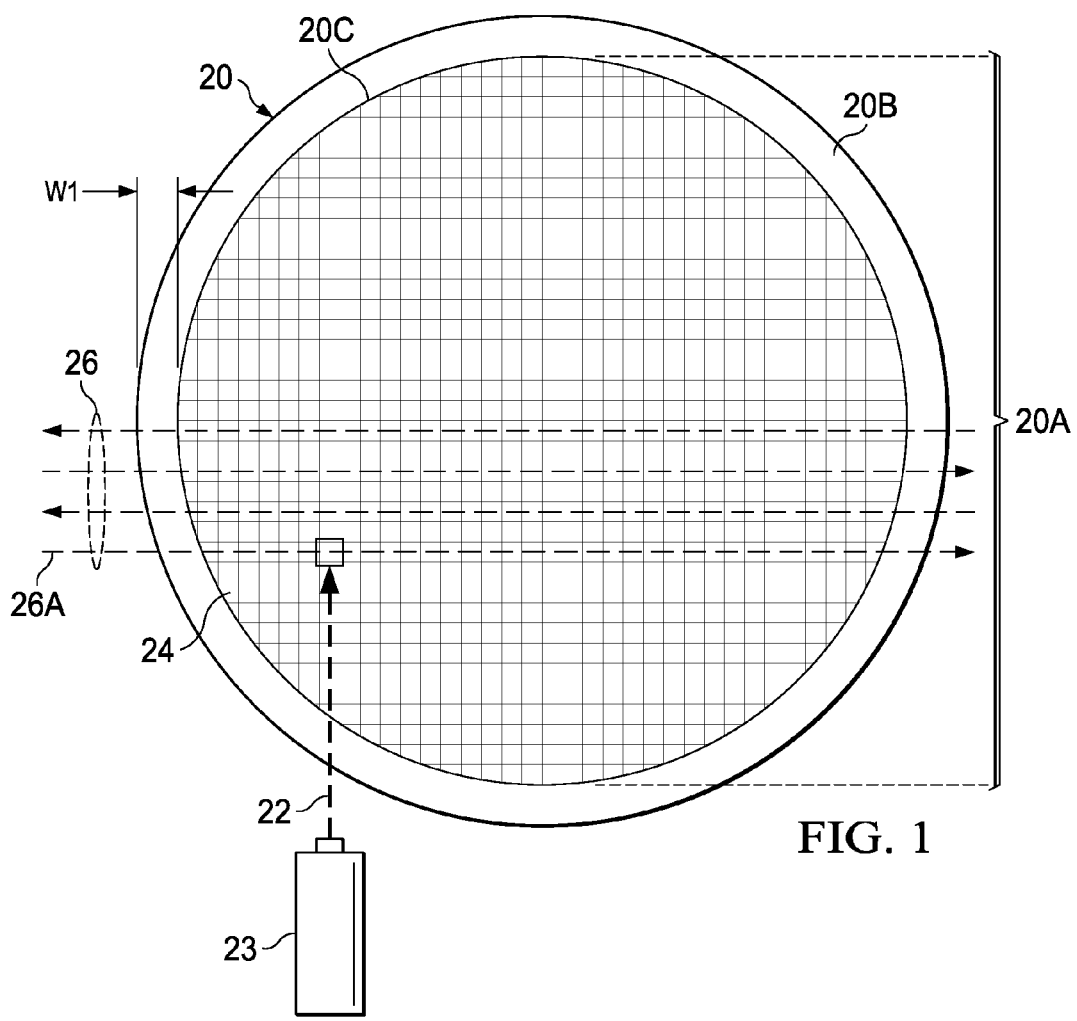
FIG. 1 illustrates a top view of a wafer scanned by a laser beam, wherein the wafer includes a wafer-edge exclusion region and an inner region encircled by the wafer-edge exclusion region.

FIG. 1 illustrates wafer 20, which is to be annealed, for example using a laser anneal or a flash anneal. In subsequently discussed embodiment, laser anneal is used as an example to explain the concept of the embodiments, although other applicable anneal methods such as flash anneal may be performed using essentially the same manner as in the exemplary embodiments. In an embodiment, the laser anneal is performed on wafer 20 that received an implantation, for example, a source/drain implantation, a lightly-doped source/drain implantation, a well implantation, or the like. During the implantation, a p-type or an n-type impurity is implanted into wafer 20. Accordingly, the implanted regions receive the laser anneal, and hence the implanted impurity is activated. Laser beam 22 is emitted by laser beam generator 23, which generates laser beam 22, and project laser beam 22 onto wafer 20. In each of the figures, a plurality of laser beams 22 may be drawn. The plurality of laser beams 22 may be projected by a same laser beam generator. Wafer 20 is scanned by laser beam 22, which is projected on the surface of wafer 20 in a plurality of passes, which passes are schematically illustrated using arrows 26. Throughout the description, one scanning path illustrated by one arrow 26, which indicates that laser beam moves in one direction, for example, may be referred to be as one "pass." Spot 24 schematically illustrates a region annealed by laser beam 22 at one time. In an embodiment, spot 24 has a size between about 0.05 mm×5 mm and about 0.1 mm×10 mm, although spot 24 may have different sizes. In a pass of the laser anneal, spot 24 moves from one end of wafer 20 to an opposite end.

Wafer 20 includes inner region 20A, in which there is a high manufacturing yield, and dies are sawed from inner region 20A. Inner region 20A may have a circular shape. Region 20B is the region extending from the edge of wafer 20 to the boundary of inner region 20A. The dies in region 20B may be incomplete, and/or may not be accepted as good dies. Throughout the description, region 20B is referred to as a wafer-edge (exclusion) region (zone), which encircles inner region 20A. In an embodiment, width W1 of wafer-edge exclusion region 20B may be between about greater than about 0.5 mm, or greater than about 1.5 mm.

Figure 2:
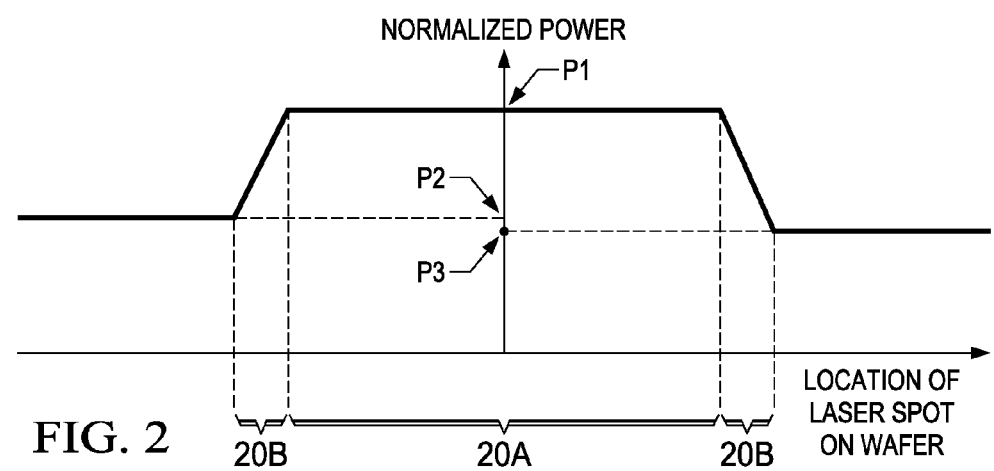
FIG. 2 schematically illustrates the normalized power in a pass of the laser beam across the wafer.

In accordance with embodiment, during the scanning, the power of laser beam 22 may be varied according to which region of wafer 20 is being scanned. The power may be measured as being watts per unit area (on wafer 20), for example, also the power may also be measured using different units. FIG. 2 schematically illustrates the normalized power of laser beam 22 in pass 26A (FIG. 1) as a function of the position of spot 24 (FIG. 1), wherein pass 26A is one of the plurality of passes 26. In an exemplary embodiment, during pass 26A, laser beam 22 enters into wafer-edge exclusion region 20B, inner region 20A, and then another wafer-edge exclusion region 20B sequentially. Referring to FIG. 2, in inner region 20A, laser beam 22 has power P1. When laser beam 22 enters into edge-exclusion regions 20B, the power of laser beam 22 is adjusted as powers P2 and P3, which are lower than power P1. In an embodiment, power P2 is equal to power P3, although powers P2 and P3 may also be different from each other. Powers P2 and P3 may be between about 10 percent and about 90 percent power P1, although powers P2 and P3 may be as small as zero watts (with laser beam 22 being turned off). In other passes 26 (FIG. 1), laser beam 22 may be controlled to have a similar pattern as in pass 26A, wherein the power of laser beam 22 in wafer-edge exclusion region 20B is lower than in inner region 20A, and the ratios of powers P2 and P3 to power P1 may be in the similar range as in pass 26A.

To ensure that the adjustment of the power of laser beam 22 is synchronized with the location of spot 24 in wafer 20, before the laser anneal, a wafer centering is performed to calibrate the position of wafer 20, and hence the center of wafer 20 is determined, and the positions of inner region 20A and wafer-edge exclusion region 20B, and their interface 20C (FIG. 1) may be found.

Figure 3:
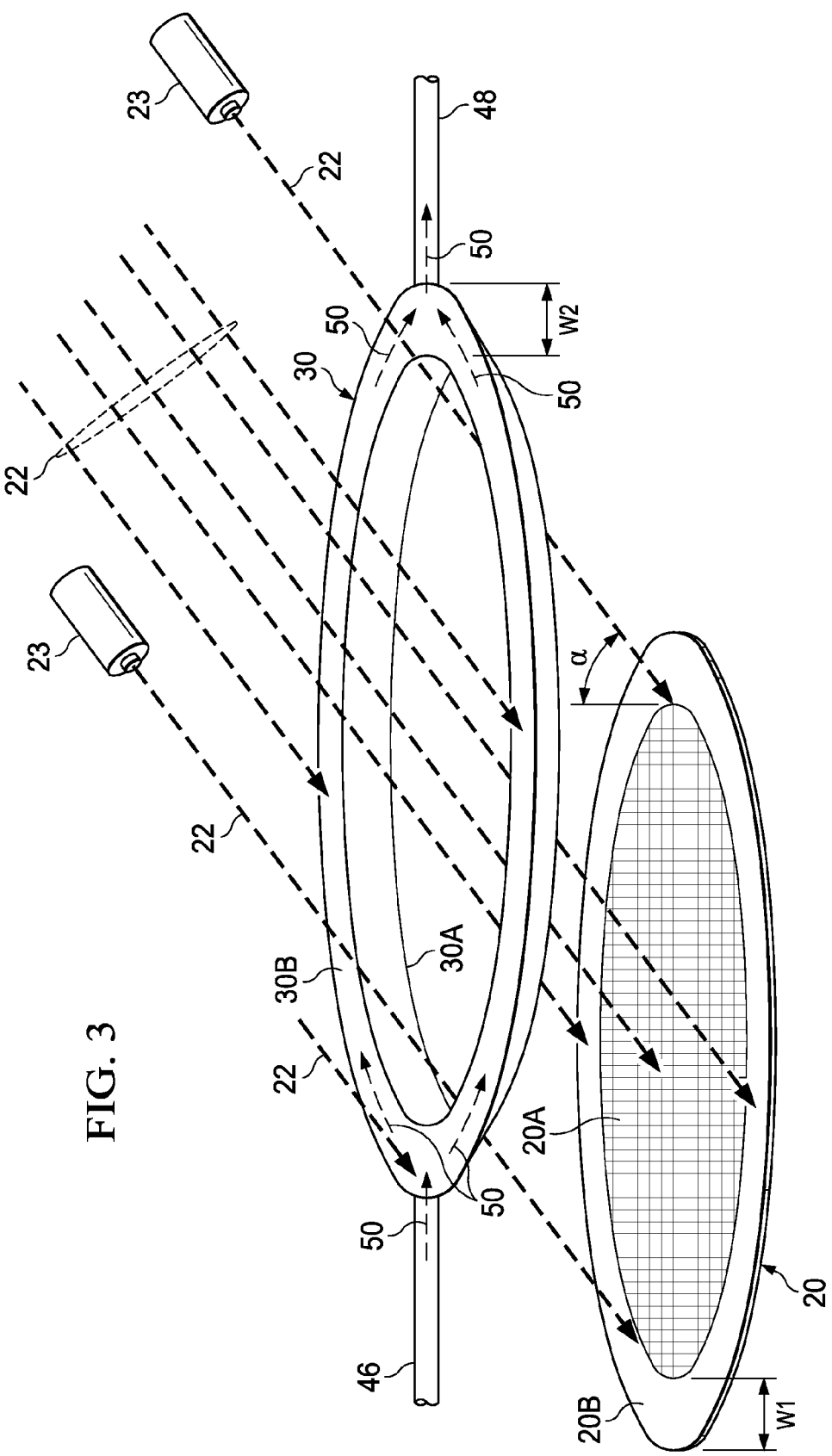
FIG. 3 illustrates that the wafer-edge exclusion region of a wafer is blocked by a wafer-edge blocker during a laser anneal, wherein the wafer-edge blocker forms a full ring, and is parallel to a major surface of the wafer.

FIGS. 3 through 6 illustrate the laser anneal process in accordance with various alternative embodiments. Unless specified otherwise, the reference numerals in these embodiments represent like elements in the embodiments illustrated in FIGS. 1 and 2. In these embodiments, instead of reducing the power of laser beam 22 when wafer-edge exclusion region 20B is scanned, wafer-edge blockers 30 are used. Referring to FIG. 3, laser beam 22 is generated by laser beam generator 23, and projected onto wafer 20. Wafer-edge blocker 30 is disposed over wafer 20, and blocks laser beam 22 from being projected to at least a part of, and possibly an entirety of, wafer-edge exclusion region 20B. Inner region 20A, however, may receive laser beam 22 that is not blocked by wafer-edge blocker 30. Wafer-edge blocker 30 may be spaced apart from wafer 20, although it may also be in contact with wafer 20, for example, when wafer-edge blocker 30 is formed of ceramic.

As shown in FIG. 3, the location and the shape of inner edge 30A of wafer-edge blocker 30 determine which part of wafer 20 may receive laser beam 22, and which part of wafer 20 is blocked from receiving laser beam 22. The outer edge 30B, on the other hand, may have any shape, as long as width W2 of wafer-edge blocker 30 is greater than width W1 of the respective part of wafer-edge exclusion region 20B. In an embodiment, laser beam 22 is projected onto wafer 20 with Brewst angle α, which may be between about 68° C. and about 72° C., for example, so that the energy of laser beam 22 may be absorbed efficiently by wafer 20. In alternative embodiments, laser beam 22 is projected using other angles, and the position and the shape of wafer-edge blocker 30 need to be adjusted accordingly to ensure the blocking of wafer-edge exclusion region 20B, and no inner region 20A is blocked.

Wafer-edge blocker 30 may be formed of a metal or a metal alloy such as copper, stainless steel, or the like. Accordingly, substantially all power of laser beam 22 is blocked, and no power is received by wafer-edge exclusion region 20B, while inner region 20A receives the full power of laser beam 22. When wafer 20 is scanned, laser beam 22 may have a uniform power regardless of which part of wafer 20 is being scanned.

In alternative embodiments, wafer-edge blocker 30 may be formed of a material that partially absorbs the power of laser beam 22, while the un-absorbed power is still projected onto wafer-edge exclusion region 20B. Inner region 20A still receives the full power since it is not blocked by wafer-edge blocker 30. In an embodiment, wafer-edge blocker 30 may be formed of glass. In alternative embodiments, wafer-edge blocker 30 may be formed of a mesh that allows the partial penetration of laser beam 22.

Since wafer-edge blocker 30 absorbs the energy from laser beam 22, wafer-edge blocker 30 may have an elevated temperature during the laser anneal. Wafer-edge blocker 30 may thus need to be cooled during the laser anneal. For example, as shown in FIG. 3, wafer-edge blocker 30 is connected to pipe 46 and pipe 48, wherein coolant 50 enters into wafer-edge blocker 30 through pipe 46 and exits wafer-edge blocker 30 through pipe 48. Wafer-edge blocker 30 is hollow to allow the flow of coolant 50. Coolant 50 may be water or oil. Although pipes 46 and 48 are not shown in FIGS. 4 through 6, each of wafer-edge blocker 30 in FIGS. 4 through 6 may include pipes 46 and 48 for introducing coolant 50 into the respective wafer-edge blocker 30.

In the embodiment shown in FIG. 3, wafer-edge blocker 30 is disposed with its major plane parallel to wafer 20. Accordingly, the inner edge of wafer-edge blocker 30 may have essentially a same shape, and possibly a same (or a similar) size, as the outer edge of inner region 20A. In alternative embodiments, wafer-edge blocker 30 may not be parallel to wafer 20. Accordingly, the inner edge of wafer-edge blocker 30 may have a different shape and a different size than the outer edge of inner region 20A. For example, in the embodiment shown in FIG. 4, wafer-edge blocker 30 is not parallel to wafer 20, and diameter D2 of inner edge 30A of wafer-edge blocker 30 is smaller than the diameter D1 of inner region 20A.

Figure 4:
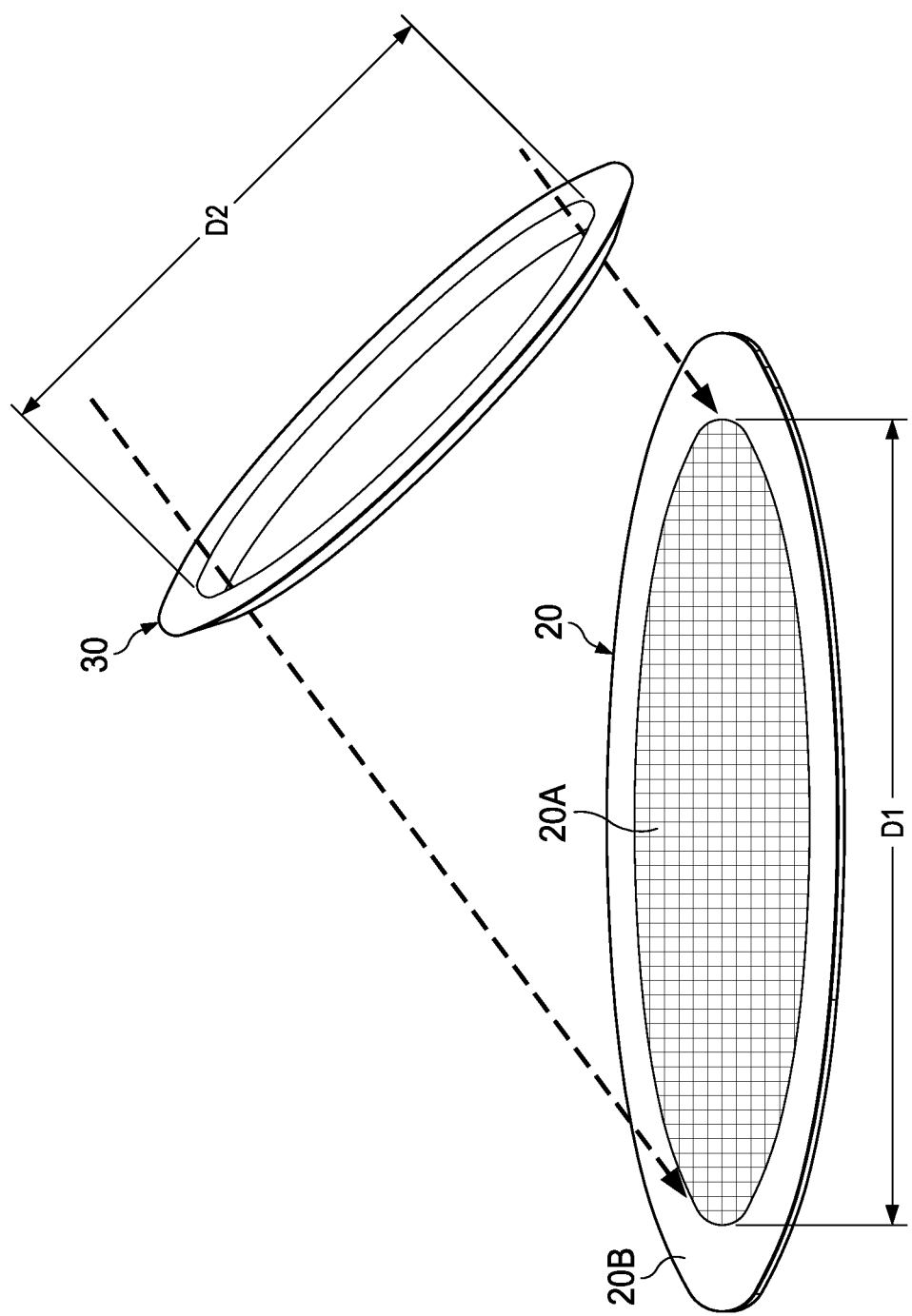
FIG. 4 illustrates that the wafer-edge exclusion region of a wafer is blocked by a wafer-edge blocker during a laser anneal, wherein the wafer-edge blocker forms a full ring, and is not parallel to the major surface of the wafer.

FIGS. 3 and 4 illustrate the embodiment wherein wafer-edge blockers 30 form full rings. In alternative embodiments, wafer-edge blocker 30 may comprise curved parts that do not form full rings. For example, in FIG. 5, wafer-edge blocker 30A/30 is a partial ring, which may be a half ring, one third of a full ring, or more or less than a half ring or a third of a full ring. Accordingly, part 20B1 of wafer-edge exclusion region 20B is blocked from receiving laser beam 22, while part 20B2 of wafer-edge exclusion region 20B is not blocked from receiving laser beam 22.

Figure 5:
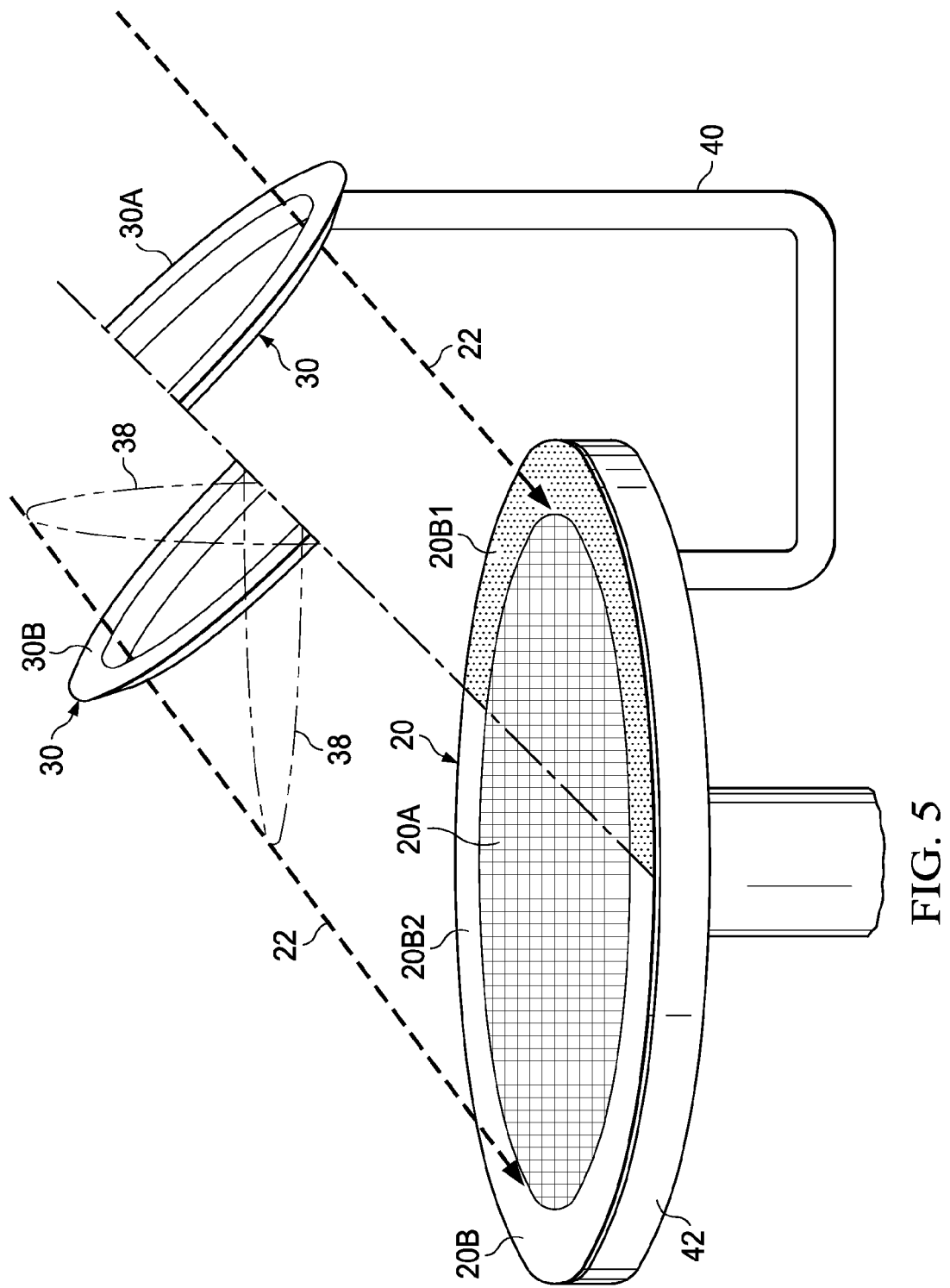
FIG. 5 illustrates that the wafer-edge exclusion region of a wafer is blocked by wafer-edge blockers, wherein each of the wafer-edge blockers forms a partial ring.

In addition to wafer-edge blocker 30A/30, another wafer-edge blocker 30B/30 may be added optionally, so that part 20B2 of wafer-edge exclusion region 20B, which is not blocked by wafer-edge blocker 30A/30, is blocked from receiving laser beam 22 by wafer-edge blocker 30B/30. Wafer-edge blockers 30A and 30B are separate pieces, and may be located separate from each other, although they may also connect to form a full ring. Wafer-edge blockers 30A and 30B in combination may block portions of (which portions are smaller than the entirety), or the entirety of, wafer-edge exclusion region 20B. In an embodiment, the blocked regions of wafer-edge blockers 30A and 30B may have some overlap to ensure all of wafer-edge exclusion region 20B is blocked. Dashed lines 38 in FIG. 5 illustrate alternative positions and shapes of wafer-edge blocker 30A. Similar to wafer-edge blocker 30A, wafer-edge blocker 30B may also have different shapes and disposed in different angles other than what are illustrated in FIG. 5.

Figure 6:
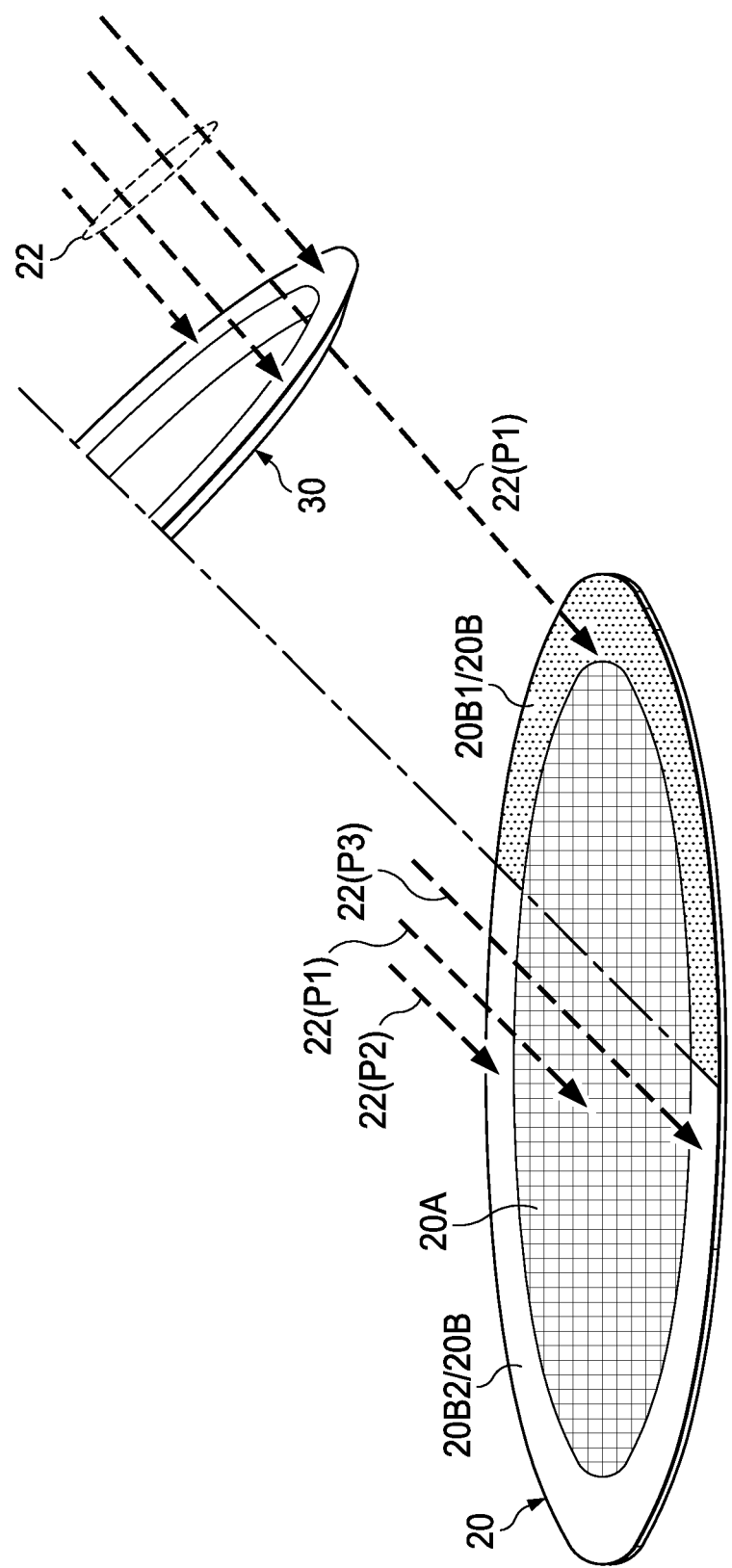
FIG. 6 illustrates that a portion of the wafer-edge exclusion region of a wafer is blocked by a wafer-edge blocker, and wherein a laser beam may reach portions of the wafer-edge region not blocked by the wafer-edge blocker.

In alternative embodiments, the embodiments as shown in FIGS. 1 and 2 may be combined with the embodiments shown in FIGS. 3 through 5. For example, FIG. 6 illustrates an embodiment wherein a first part of wafer-edge exclusion region 20B1 is blocked by wafer-edge blocker 30. The remaining portion 20B2 of wafer-edge exclusion region 20B is not blocked by any wafer-edge blocker. Instead, the scanning of portion 20B2 of wafer-edge exclusion region 20B adopts adjusted power as shown in FIGS. 1 and 2, wherein when portion 20B2 of wafer-edge exclusion region 20B is scanned with laser beam 22, a low power (such as P2 or P3 in FIG. 2) is used, while when inner region 20A of wafer 20 is scanned, a high power (such as P1) is used.

Referring back to FIG. 5, wafer-edge blocker 30 may be attached to arm 40, which is further connected to wafer holder 42, on which wafer 20 is located. Wafer holder 42 may be an E-chuck, for example. Therefore, the bottom of wafer-edge blocker 30 does not have to be resided on the top of wafer holder 42. In alternative embodiments, wafer-edge blocker 30 may reside on wafer holder 42 (which needs a size greater than the size of wafer 20) directly to block the tilt laser beam 22. In the embodiments shown in FIGS. 3, 4, and 6, similar arms 40 as in FIG. 5 may also be used to support wafer-edge blockers 30 at desirable positions. In the respective production tool for performing the (laser) anneal, wafer-edge blocker 30 also blocks laser beam 22 from reaching the edge portion(s) of the wafer-holding region of wafer holder 42, wherein the wafer-holding region is the portion of the surface of wafer holder 42 that overlaps wafer 20).

In the embodiments, by reducing or blocking the power of the laser beam that is projected on wafer edge exclusion regions, the cracks in wafers caused by the laser anneal is significantly reduced. Experiment results performed on sample wafers indicated that the embodiments have a significant effect in the reduction of wafer crack caused by laser anneal. In the experiment, two groups of sample wafers identical to each other were annealed. When the laser anneal is used to anneal the first group of sample wafers using conventional annealing methods, as many as 3 wafers among 7 sample wafers cracked. When annealing the second group of sample wafers, the power of the laser beam is reduced when the edges of sample wafers are scanned. As a result, none of 10 sample wafers cracked.

In accordance with embodiments, a method includes performing an anneal on a wafer. The wafer includes a wafer-edge region, and an inner region encircled by the wafer-edge region. During the laser anneal, a first power applied on a portion of the wafer-edge region is at least lower than a second power for annealing the inner region.

In accordance with other embodiments, a method includes performing a laser anneal on a wafer. The wafer includes a wafer-edge exclusion region, and an inner region encircled by the wafer-edge exclusion region. The step of performing the laser anneal includes annealing a portion of the wafer-edge exclusion region using a first power, and adjusting the laser beam to anneal the inner region using a second power higher than the first power.

In accordance with yet other embodiments, an apparatus for performing a laser annealing on a wafer is provided. The apparatus includes a wafer holder for holding the wafer thereon, a laser beam generator configured to generate a laser beam, and a wafer-edge blocker having a curved inner edge. The wafer-edge blocker is configured to at least partially block the laser beam from reaching a portion of a wafer-edge exclusion region of the wafer. The wafer-edge blocker is configured not to block an inner region of the wafer from the laser beam, wherein the inner region of the wafer is encircled by the wafer-edge exclusion region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    placing a wafer-edge blocker over a wafer, wherein the wafer-edge blocker is spaced apart from the wafer, wherein the wafer-edge blocker comprises:
        a first partial ring; and
        a second partial ring physically disconnected from the first partial ring; and
    performing an anneal on the wafer by projecting a laser beam to the wafer, wherein the wafer comprises a wafer-edge region, and an inner region encircled by the wafer-edge region, and wherein during the anneal, a first power of the laser beam applied on a first portion of the wafer-edge region is reduced by the wafer-edge blocker to at least lower than a second power of the laser beam for annealing the inner region, wherein during the anneal, inner edges of the first partial ring and the second partial ring are projected to overlap a circular interface between the wafer-edge region and the inner region.

2. The method of claim 1 further comprising, during the anneal, conducting a coolant into the wafer-edge blocker.

3. The method of claim 1, wherein the wafer-edge blocker comprises a first portion overlapping the wafer, and a second portion misaligned from the wafer.

4. The method of claim 1, wherein during the anneal, the laser beam is fully blocked from reaching the first portion of the wafer-edge region by the wafer-edge blocker, with the first portion of the wafer-edge region forming a full ring having a round inner boundary, and wherein the inner region is not blocked from receiving the laser beam.

5. The method of claim 1, wherein the wafer-edge blocker forms a full ring, and wherein an entirety of the wafer-edge region is blocked by the wafer-edge blocker from receiving the laser beam.

6. The method of claim 1, wherein the wafer-edge blocker forms a first partial ring, and wherein a second portion of the wafer-edge region receives the laser beam.

7. The method of claim 1, wherein the wafer-edge region forms a full ring, with an inner edge of the full ring being circular, and an outer edge of the full ring overlap an outer edge of the wafer.

8. A method comprising:
    performing a laser anneal on a wafer, wherein the wafer comprises a wafer-edge region, and an inner region encircled by the wafer-edge region, and wherein the step of performing the laser anneal comprises:
        adjusting a laser beam generator to generate a laser beam having a first power;
        annealing a first portion of the wafer-edge region using the laser beam having the first power;
        adjusting the laser beam generator to adjust the laser beam to have a second power higher than the first power; and
        annealing the inner region using the laser beam having the second power.

9. The method of claim 8, wherein the step of performing the laser anneal comprises a plurality of passes crossing the wafer, and wherein during one of the plurality of passes, the laser anneal comprises the steps of:
    adjusting the laser beam generator to adjust a power of the laser beam to the first power to anneal the first portion of the wafer-edge region;
    adjusting the laser beam generator to increase the power of the laser beam to the second power to anneal the inner region; and
    adjusting the laser beam generator to reduce the power of the laser beam to the first power to anneal a second portion of the wafer-edge region, wherein the first portion and a second portion are on opposite sides of the inner region.

10. The method of claim 8, wherein the first power is between about 10 percent and about 90 percent of the second power.

11. The method of claim 8 further comprising blocking a laser beam of the laser anneal from reaching a second portion of the wafer-edge region using a wafer-edge blocker, wherein the wafer-edge blocker does not block the laser beam from reaching the first portion of the wafer-edge region and the inner region.

12. The method of claim 11, wherein the wafer-edge blocker comprises a first portion overlapping the wafer, and a second portion misaligned from the wafer.

13. A method comprising:
   placing a wafer-edge blocker on a path of a laser beam to a portion of a wafer, wherein the wafer-edge blocker is physically disconnected from the wafer;
   scanning a wafer using the laser beam to anneal a center region of the wafer, wherein the laser beam is blocked from being projected on an edge region of the wafer by the wafer-edge blocker; and
   during the anneal, conducting a coolant into the wafer-edge blocker.

14. The method of claim 13, wherein the wafer-edge blocker comprises a curved inner edge.

15. The method of claim 13, wherein the laser beam reaches a center part of the wafer through a ring formed by an inner edge of the wafer-edge block.

16. The method of claim 13, wherein the laser beam is blocked partially from being projected on the edge region of the wafer.

17. The method of claim 13, wherein the laser beam is blocked fully from being projected on the edge region of the wafer.

18. The method of claim 13 further comprising:
   adjusting a laser beam generator to generate the laser beam to a first power and to anneal a wafer-edge region of the wafer, with the first power being greater than zero watts; and
   increasing the laser beam by adjusting the laser beam generator to a second power higher than the first power to anneal the center region of the wafer.

19. The method of claim 13, wherein the wafer-edge blocker comprises a first partial ring and a second partial ring physically separated from the first partial ring, and wherein in the scanning, an entirety of the edge region of the wafer is blocked from receiving the laser beam by the first partial ring and the second partial ring, with the edge region forms a full ring.

* * * * *